(12) United States Patent
Esumi et al.

(10) Patent No.: US 7,849,388 B2
(45) Date of Patent: Dec. 7, 2010

(54) SIGNAL DECODING METHOD AND DEVICE, AND SIGNAL STORAGE SYSTEM

(75) Inventors: Atsushi Esumi, Kyoto (JP); Hidemichi Mizuno, Musashimurayama (JP)

(73) Assignee: Rohm Co., Ltd. (JP)

( * ) Notice: Subject to any disclaimer, the term of this patent is extended or adjusted under 35 U.S.C. 154(b) by 1112 days.

(21) Appl. No.: 11/524,548

(22) Filed: Sep. 21, 2006

(65) Prior Publication Data

US 2007/0110188 A1 May 17, 2007

(30) Foreign Application Priority Data

Sep. 22, 2005 (JP) .............................. 2005-276705

(51) Int. Cl.
*G06F 11/00* (2006.01)
(52) U.S. Cl. ..................................... 714/800
(58) Field of Classification Search ................ 714/752, 714/758, 784, 800
See application file for complete search history.

(56) References Cited

U.S. PATENT DOCUMENTS 7,225,386 B2 * 5/2007 Murillo ...................... 714/758

FOREIGN PATENT DOCUMENTS

JP 2003-115768 4/2003

OTHER PUBLICATIONS

Japanese Office Action for Patent Application No. 2005-276705 dated Nov. 11, 2008; with English translation.

Tadashi Wadayama, "Greedy Construction of LDPC Codes for Burst Erasure Channel"; IEICE Technical Report, IT2004-44 Japan, Sep. 2004, pp. 35-40; with English translation.

Yang et al., "Performance of Efficiently Encodable Low-Density Parity-Check Codes in Noise Bursts on the EPR4 Channel"; IEEE Transactions on Magnetics; US, Mar. 2004, vol. 40, No. 2, pp. 507-512; with English Translation.

Japanese Office Action for Japanese Patent Application No. 2005-276705 dated Apr. 14, 2009 with English Translation.

Japanese Office Action for Patent Application No. 2005-276705 dated Jun. 24, 2008; with English translation.

"Application of Low Density Parity Check Code and Iterative Decoding to Magnetic Recording System"; Esumi et al. IEICE Technical Report, Japan Dec. 2002, vol. 102, No. 499, p. 13-18; with English Abstract.

* cited by examiner

*Primary Examiner*—Shelly A Chase
(74) *Attorney, Agent, or Firm*—Cantor Colburn LLP (57) ABSTRACT

An LDPC unit decoder included in a signal decoding device is provided with a parity checking unit that is a multiplier for performing multiplication of a check matrix (parity check matrix) and temporary estimated values of an encoded signal, computed by a temporary estimated value computation unit. A check matrix holding unit holds the check matrix. If s and t are natural numbers, $s \geq t \geq 2$, among s columns extracted from this check matrix, t columns or less have a linearly independent relationship. These s columns are multiplied at locations where error occurrence frequency is relatively high, with regard to the temporary estimated values. According to this mode, the matrix is composed to include t columns that are linearly independent, that is, t columns that are not linearly dependent.

15 Claims, 9 Drawing Sheets

$$H = \begin{bmatrix} 1 & 1 & 1 & 1 & 1 & 1 & 0 & 0 & 0 & 0 & 0 & 0 & 0 & 0 & 0 & 0 & 1 \\ 1 & 1 & 1 & 0 & 0 & 0 & 1 & 1 & 1 & 0 & 0 & 0 & 0 & 0 & 0 & 1 & 1 \\ 1 & 0 & 0 & 1 & 1 & 0 & 1 & 1 & 0 & 1 & 0 & 0 & 0 & 0 & 1 & 0 & 0 \\ 0 & 1 & 0 & 1 & 0 & 1 & 1 & 0 & 1 & 1 & 0 & 0 & 0 & 1 & 0 & 0 & 0 \\ 0 & 0 & 1 & 0 & 1 & 1 & 0 & 1 & 1 & 0 & 1 & 1 & 0 & 1 & 0 & 0 & 0 \\ 0 & 0 & 0 & 0 & 1 & 1 & 0 & 0 & 0 & 1 & 1 & 1 & 1 & 0 & 0 & 0 & 0 \end{bmatrix}$$

NO ERROR ··· $[0\ 0\ 0\ 0\ 0\ 0\ \cdots\ 0\ \cdots\ 0\ \cdots\ 0\ \cdots\ 0\ 0\ 0\ 0\ 0] \times H^T = [0\ 0\ 0\ 0\ 0\ 0]$ ERROR AT ONE LOCATION ··· $[0\ 0\ 0\ 0\ 0\ 0\ \cdots\ 0\ \cdots\ 0\ \cdots\ 1\ \cdots\ 0\ 0\ 1\ 0\ 0] \times H^T = [0\ 0\ 1\ 0\ 1\ 1]$ ERROR AT TWO LOCATIONS ··· $[0\ 0\ 0\ 0\ 0\ 0\ \cdots\ 0\ \cdots\ 1\ \cdots\ 0\ \cdots\ 0\ 0\ 1\ 0\ 0] \times H^T = [0\ 0\ 1\ 1\ 0\ 0]$

ERROR AT THREE LOCATIONS ··· $[0\ 0\ 0\ 0\ 0\ 0\ \cdots\ 0\ \cdots\ 1\ \cdots\ 1\ \cdots\ 0\ 0\ 1\ 0\ 0] \times H^T = [0\ 0\ 0\ 0\ 0\ 0]$

FIG.6A $$\beta = \begin{bmatrix} 0 & 0 & 0 \\ 0 & 0 & 0 \\ 1 & 0 & 1 \\ 0 & 1 & 1 \\ 1 & 1 & 0 \\ 1 & 1 & 0 \\ \vdots & \vdots & \vdots \end{bmatrix}$$

$\alpha = \begin{bmatrix} 0 & 0 & 0 \end{bmatrix}$    $\gamma = \begin{bmatrix} 0 & 0 & 0 & 0 & 0 & 0 \end{bmatrix}$

FIG.6B

$\alpha = \begin{bmatrix} 1 & 0 & 0 \end{bmatrix}$    $\gamma = \begin{bmatrix} 0 & 0 & 1 & 0 & 1 & 1 \end{bmatrix}$

FIG.6C $\alpha = \begin{bmatrix} 1 & 1 & 0 \end{bmatrix}$    $\gamma = \begin{bmatrix} 0 & 0 & 1 & 1 & 0 & 0 \end{bmatrix}$

FIG.6D $\alpha = \begin{bmatrix} 1 & 1 & 1 \end{bmatrix}$    $\gamma = \begin{bmatrix} 0 & 0 & 0 & 0 & 0 & 0 \end{bmatrix}$

SIGNAL DECODING METHOD AND DEVICE, AND SIGNAL STORAGE SYSTEM

BACKGROUND OF THE INVENTION

1. Field of the Invention

The present invention relates to technology for decoding signals that have been encoded.

2. Description of the Related Art

When encoded signals are decoded, detection and correction of errors due to noise or the like are carried out. As one code for encoding signals, for example, low density parity check (expressed as LDPC below) code may be cited. When a signal encoded using the LDPC code is decoded (LDPC decoding), a decoded signal is multiplied by a check matrix (parity check matrix). In this way, detection of errors occurring with decoded signals is possible. Various methods have been proposed as methods of composing this check matrix (parity check matrix). For example, Patent Document 1 discloses a method of composing the check matrix (parity check matrix) in which a part of a matrix, defined according to a definition of a check matrix (parity check matrix) related to array codes, is modified to an upper triangular structure.

Patent Document 1: Japanese Patent Application, Laid Open No. 2003-115768

However, there are cases in which, according to the structure of the check matrix (parity check matrix), some errors occurring in the decoded signals cannot be detected.

SUMMARY OF THE INVENTION

The present invention has been made in view of the above described circumstances, and an overall object thereof is the formation of a check matrix (parity check matrix) that can suitably detect errors.

When a plurality of columns having a linearly dependent relationship (described below as linear dependent columns) are included in the check matrix (parity check matrix), if all the linearly dependent columns are multiplied at positions at which errors occur in decoded signals, the errors therein cannot be detected, as described below. The present inventers focused on this point, and by composing a check matrix (parity check matrix) in which all the linearly dependent rows are not multiplied at positions at which errors occur in the decoded signals, arrived at the present invention that realizes suitable error detection.

One mode of the present invention relates to a signal decoding method. In this signal decoding method, when an encoded signal belonging to an input signal series is decoded, a matrix is made to operate on this decoded signal series to raise decoding accuracy. If s and t are natural numbers, $s \geq t \geq 2$, using a matrix in which, among s columns extracted from this matrix, t columns or less have a linearly independent relationship, the s columns are multiplied by a signal in which error occurrence is relatively high, in the decoded signal series.

According to this mode, the matrix is composed to include t linearly independent columns, that is t columns that are not linearly dependent. In this way, in a decoded signal series, when errors occur at t locations, since it is possible to avoid multiplying all the linearly dependent columns at locations where the errors occur, errors with a relatively high frequency of occurrence can be suitably detected.

Another mode of the present invention also relates to a signal decoding method. In this signal decoding method, when an encoded signal belonging to an input signal series is decoded, a matrix is made to operate on this decoded signal series, so as to raise decoding accuracy. If s and t are natural numbers, $s \geq t \geq 2$, using a matrix in which, among s columns extracted from this matrix, t columns or less have a linearly independent relationship, the s columns are adjacent columns in the matrix.

According to this mode, the matrix is composed to include, and make adjacent, the t columns that are linearly independent. In this way, in cases in which errors occur continuously at t locations in the decoded signal series (also described as burst errors), since it is possible to avoid multiplying the linearly dependent columns at the locations where the burst errors occur, these burst errors can be suitably detected.

Another mode of the present invention also relates to a signal decoding method. In this signal decoding method, when an encoded signal belonging to an input signal series is decoded, a matrix of m rows and n columns (m and n are natural numbers, m, $n \geq 2$) is operated on this decoded signal series, so as to raise decoding accuracy. The matrix includes a first and a second partial matrix of m rows and s columns (s is a natural number, n>s) linked in a columnar direction, and among s columns in the first and the second partial matrices, t columns or less (t is a natural number, $s \geq t \geq 2$) have a linearly independent relationship.

According to this mode, in the matrix, a linearly dependent relationship is not established in t columns or less. In this way, if the number of errors occurring is t or less, since it is possible to avoid multiplying all linearly dependent columns, by errors occurring at the t locations, it is possible to detect these errors.

Another mode of the present invention is related to a signal decoding device. This signal decoding device is provided with a unit decoder that, when an input signal series is acquired and an encoded signal belonging to this input signal series is decoded, performs multiplication of this decoded signal series by a matrix. If s and t are natural numbers, $s \geq t \geq 2$, the unit decoder uses a matrix in which, among s columns extracted from the matrix, t columns or less have a linearly independent relationship. The s columns are multiplied by signals in which error occurrence frequency is relatively high, in the decoded signal series.

According to this mode, the matrix is composed to include t columns that are linearly independent, that is, t columns that are not linearly dependent. When errors occur at t locations in the decoded signal series, since none of the linearly dependent columns are multiplied at the locations where these errors occur, the unit decoder can suitably detect errors that have a relatively high frequency of occurrence.

Another mode of the present invention is related to the signal decoding device. This signal decoding device is provided with a unit decoder that, when an input signal series is acquired and an encoded signal belonging to this input signal series is decoded, performs multiplication of this decoded signal series by a matrix. If s and t are natural numbers, $s \geq t \geq 2$, the unit decoder uses a matrix in which, among s columns extracted from the matrix, t columns or less have a linearly independent relationship. The s columns are adjacent columns in the matrix.

According to this mode, the matrix is composed to include, and make adjacent, the linearly independent t columns. In this way, in a decoded signal series when a burst error occurs at t locations, with regard to the unit decoder, since none of the linearly dependent columns are multiplied at the locations where the burst errors occur, these burst errors can be suitably detected.

Another mode of the present invention is related to the signal decoding device. This signal decoding device is provided with a unit decoder that, when an input signal series is acquired and an encoded signal belonging to this input signal series is decoded, performs multiplication of this decoded signal series by a matrix of m rows and n columns (m and n are natural numbers, m, n≧2). The matrix includes a first and a second partial matrix of m rows and s columns (s is a natural number, n>s) linked in a columnar direction, and, in the first and the second partial matrices, among the s columns, t columns or less (t is a natural number, s≧t≧2) have a linearly independent relationship.

According to this mode, in the matrix, a linearly dependent relationship is not established in the t columns or less. In this way, if the number of errors occurring is t or less, since all linearly dependent columns are not multiplied by errors occurring at the t locations, it is possible to detect these errors.

The second partial matrix may be a matrix obtained by applying prescribed shift processing to elements of the first partial matrix. Furthermore, this shift processing may include row replacement. In this way, if the first partial matrix is composed, the second partial matrix can be formed by applying the prescribed shift processing to the elements of the first partial matrix, so that the matrix can be easily composed.

In the signal decoding device, the value of t may be decided based on a tolerance limit of errors occurring in signals belonging to the decoded signal series, that cannot be detected when decoding. According to this mode, even in cases in which all errors are not detected, the value of t is determined so that a detection result for the errors is within an allowable range. That is, among the t columns determined here, by composing a matrix such that linearly dependent columns are not included, the error detection within the allowable range is possible. In this way, since it is no longer necessary to compose the matrix so that all errors are detected, it is possible to compose the matrix more easily.

The unit decoder may decode the encoded signals using a low density parity check code. According to this mode, it is possible to detect errors occurring in signals that have been LDPC decoded.

Another mode of the present invention is related to a signal storage system. This signal storage system includes a write channel and a read channel. The write channel includes a first encoder for run-length encoding of data, a second encoder for further encoding data encoded by the first encoder, using a low density parity check code, and a writing unit for writing the data encoded by the second encoder, to the storage device. The read channel includes a reading unit for reading the data encoded by the second encoder, from the storage device, a soft output detection unit for calculating likelihood for the data read by the reading unit and for outputting a soft decision value, a second decoder, corresponding to the second encoder, for decoding the data outputted from the soft output detection unit, and a first decoder, corresponding to the first encoder, for further decoding the data decoded by the second decoder. The second decoder has a unit decoder that, when the data outputted from the soft output detection unit is decoded, performs multiplication of the decoded data and the matrix; if s and t are natural numbers, s≧t≧2, the unit decoder uses a matrix in which, among s columns extracted from the matrix, t columns or less have a linearly independent relationship. The s columns are multiplied by a portion in which frequency of error occurrence in the decoded data is relatively high. The signal storage system may be integrated on at least one semiconductor board.

According to this mode, the matrix is composed to include t columns that are linearly independent, that is, t columns that are not linearly dependent. When errors occur at t locations in the decoded data, since none of the linearly dependent columns are multiplied at these locations where the errors occur, errors that have a relatively high frequency of occurrence in the data read from the storage device, can be suitably detected.

Another mode of the present invention is related to the signal storage system. This signal storage system includes a write channel and a read channel. The write channel includes a first encoder for run-length encoding of data, a second encoder for further encoding data encoded by the first encoder, using a low density parity check code, and a writing unit for writing the data encoded by the second encoder to the storage device. The read channel includes a reading unit for reading the data encoded by the second encoder, from the storage device, a soft output detection unit for calculating likelihood for the data read by the reading unit and for outputting a soft decision value, a second decoder, corresponding to the second encoder, for decoding the data outputted from the soft output detection unit, and a first decoder, corresponding to the first encoder, for further decoding the data decoded by the second decoder. The second decoder has a unit decoder that, when the data outputted from the soft output detection unit is decoded, performs multiplication of the decoded data by the matrix. If s and t are natural numbers, s≧t≧2, the unit decoder uses a matrix in which, among s columns extracted from the matrix, t columns or less have a linearly independent relationship. The s columns are adjacent columns in the matrix. The signal storage system may be integrated on at least one semiconductor board.

According to this mode, the matrix is composed to include, and make adjacent, the t columns that are linearly independent, that is, t columns that are not linearly dependent. In this way, in the decoded data, when burst errors occur at the t locations, since none of the linearly dependent columns are multiplied at these locations where the burst errors occur, these burst errors in the data read from the storage device can be suitably detected.

The signal storage system may further include a storage device for storing prescribed data, and a controller for controlling writing of data to the storage device, and reading of data from the storage device; the read channel may, according to an instruction of the controller, read data stored in the storage device; and the write channel may, according to an instruction from the controller, write prescribed data to the storage device. According to this mode, errors in the data, read from the storage device by control by the controller, can be suitably detected.

Furthermore, optional combinations of the above component elements, and changes in the method, device, the system, computer programs, storage media, and the like, in the description of the present invention are also valid modes of the invention.

DETAILED DESCRIPTION OF THE INVENTION

The invention will now be described by reference to the preferred embodiments. This does not intend to limit the scope of the present invention, but to exemplify the invention.

The present embodiment describes detection of errors generated when LDPC decoding of signals, that is, data, read from a magnetic disk device, is carried out. Specifically, by arranging linearly dependent columns at positions that are mutually non-adjacent, to compose a check matrix (parity check matrix), multiplication of all linearly dependent columns, at positions where burst errors occur, is avoided. In addition, in this way, detection of these burst errors is realized.

Figure 1:
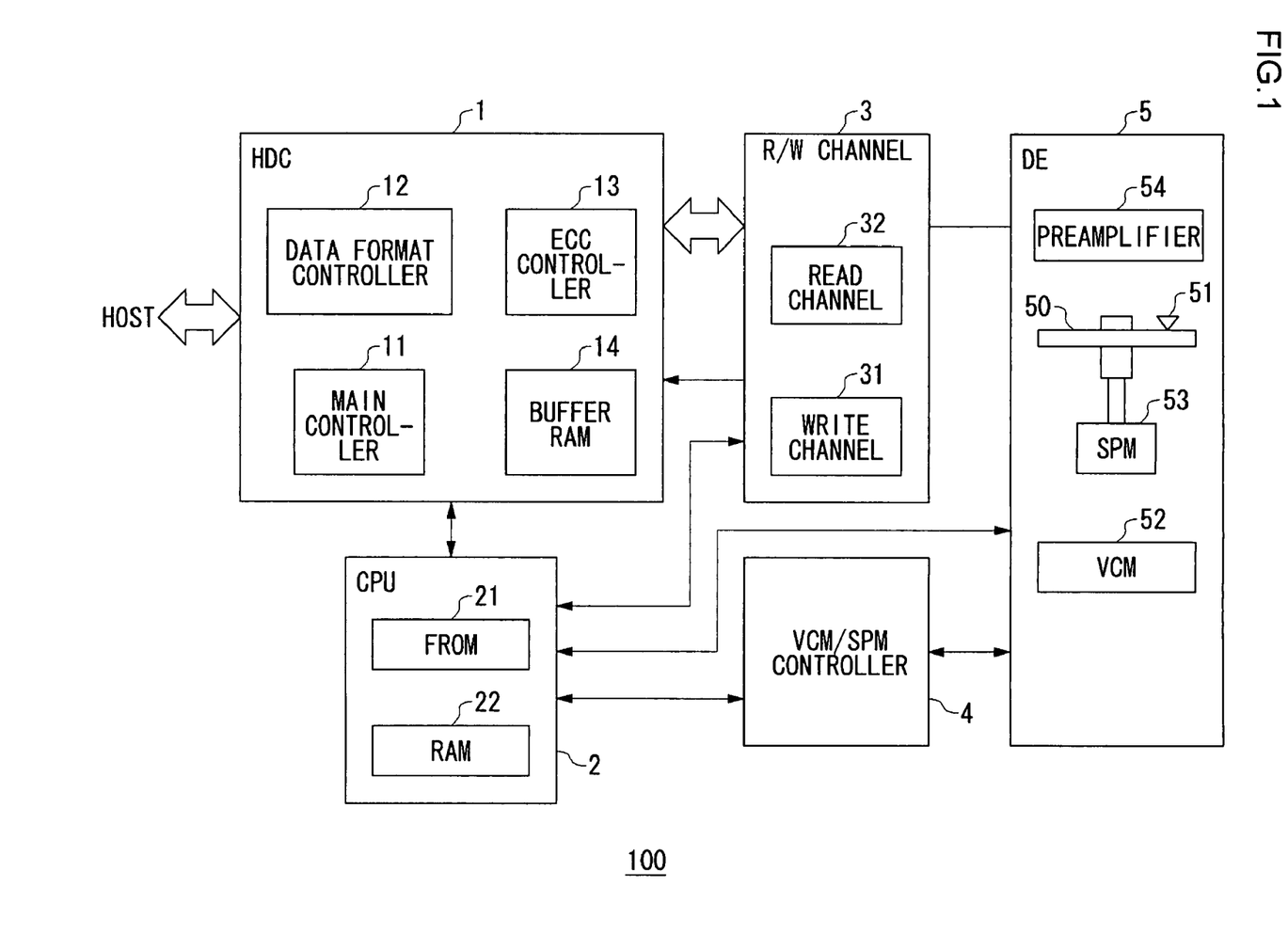
FIG. 1 is a view showing a configuration of a magnetic disk device of an embodiment.

FIG. 1 is a view showing a configuration of the magnetic disk device 100. The magnetic disk device 100 of FIG. 1, broadly divided, includes a hard disk controller 1 (below, abbreviated to HDC 1), a central processing unit 2 (below, abbreviated to CPU 2), a read-write channel 3 (below, abbreviated to R/W channel 3), a voice coil motor/spindle motor controller 4 (below, abbreviated to VCM/SPM controller 4), and a disk enclosure 5 (below, abbreviated to DE 5). In general, the HDC 1, the CPU 2, the R/W channel 3, and the VCM/SPM controller 4 are integrated on at least one semiconductor board.

The HDC 1 includes a main controller 11 for controlling the whole HDC 1, a data format controller 12, an error correction encoding controller 13 (below, abbreviated to ECC controller 13), and a buffer RAM 14. The HCD 1 is connected to a host system via an interface unit, not shown in the figure, and, in addition, is connected to the DE 5, via the R/W channel 3, and transfers data between the host and the DE 5, by control of the main controller 11. A read reference clock (RRCK) generated by the R/W channel 3 is input to this HDC 1. The data format controller 12 converts data transferred from the host into a format suitable for recording on the disk media 50, and conversely, converts data reproduced from the disk media 50 into a format suitable for transferring to the host. The disk media 50 includes, for example, a magnetic disk. In order to enable correction of errors and detection of errors included in the data reproduced from the disk media 50, the ECC controller 13 adds redundant symbols, with recorded data as information symbols. Furthermore, the ECC controller 13 judges whether an error has occurred in the reproduced data. When there is an error, correction or detection is carried out. However, the number of symbols that can correct errors is limited, and the number of symbols that can correct errors depends on length of redundant data. More specifically, since formatting efficiency deteriorates if much redundant data is added, there is a trade-off with the number of possible symbols for error correction. In cases in which Reed-Solomon (RS) code is used as the ECC to perform error correction, up to ((number of redundant symbols)/2) errors can be corrected. The buffer RAM 14 temporarily stores data transferred from the host, and transfers the data with suitable timing to the R/W channel 3; and conversely, temporarily stores read data transferred from the R/W channel 3, and after completion of the ECC decoding processing, transfers the data with suitable timing to the host.

The CPU 2 includes a flash ROM 21 (below, abbreviated as FROM 21), and a RAM 22, and is connected to the HDC 1, the R/W channel 3, the VCM/SPM controller 4, and the DE 5. An operational program of the CPU 2 is stored in the FROM 21.

The R/W channel 3 is largely divided into a write channel 31 and a read channel 32, and performs transfer of recorded data and reproduced data with the HDC 1. Furthermore, the R/W channel 3 is connected to the DE 5, and performs transmission of a recorded signal and receipt of a reproduced signal. Details are described below.

The VCM/SPM controller 4 controls a voice coil motor 52 (below, abbreviated as VCM 52) and a spindle motor 53 (below, SPM 53).

The DE 5 is connected to the R/W channel 3, and performs reception of a recorded signal and transmission of a reproduced signal. Furthermore, the DE 5 is connected to the VCM/SPM controller 4. The DE 5 includes the disk media 50, a head 51, the VCM 52, the SPM 53, and a preamplifier 54. In the magnetic disk device 100 of FIG. 1, it is assumed that there is one of the disk media 50, and that the head 51 is arranged on one side only of the disk media 50; however, the configuration may also have a plurality of disk media 50 arranged in a stack. Moreover, in general, the head 51 is arranged to correspond to each side of the disk media 50. The recorded signal transmitted by the R/W channel 3 is supplied via the preamplifier 54 inside the DE 5 to the head 51, and is recorded on the disk media 50 by the head 51. Conversely, a signal reproduced from the disk media 50 by the head 51 is transmitted via the preamplifier 54 to the R/W channel 3. In order to position the head 51 at a target position on the disk media 50, the VCM 52 inside the DE 5 moves the head 51 in a radial direction of the disk media 50. In addition, the SPM 53 rotates the disk media 50. In general, the HDC 1, the CPU 2, the R/W channel 3, and the VCM/SPM controller 4, the preamplifier 54 and the VCM 52 are implemented on the same semiconductor integrated circuit. However, an optional combination of a portion of these may also be implemented on the same semiconductor integrated circuit.

Figure 2:
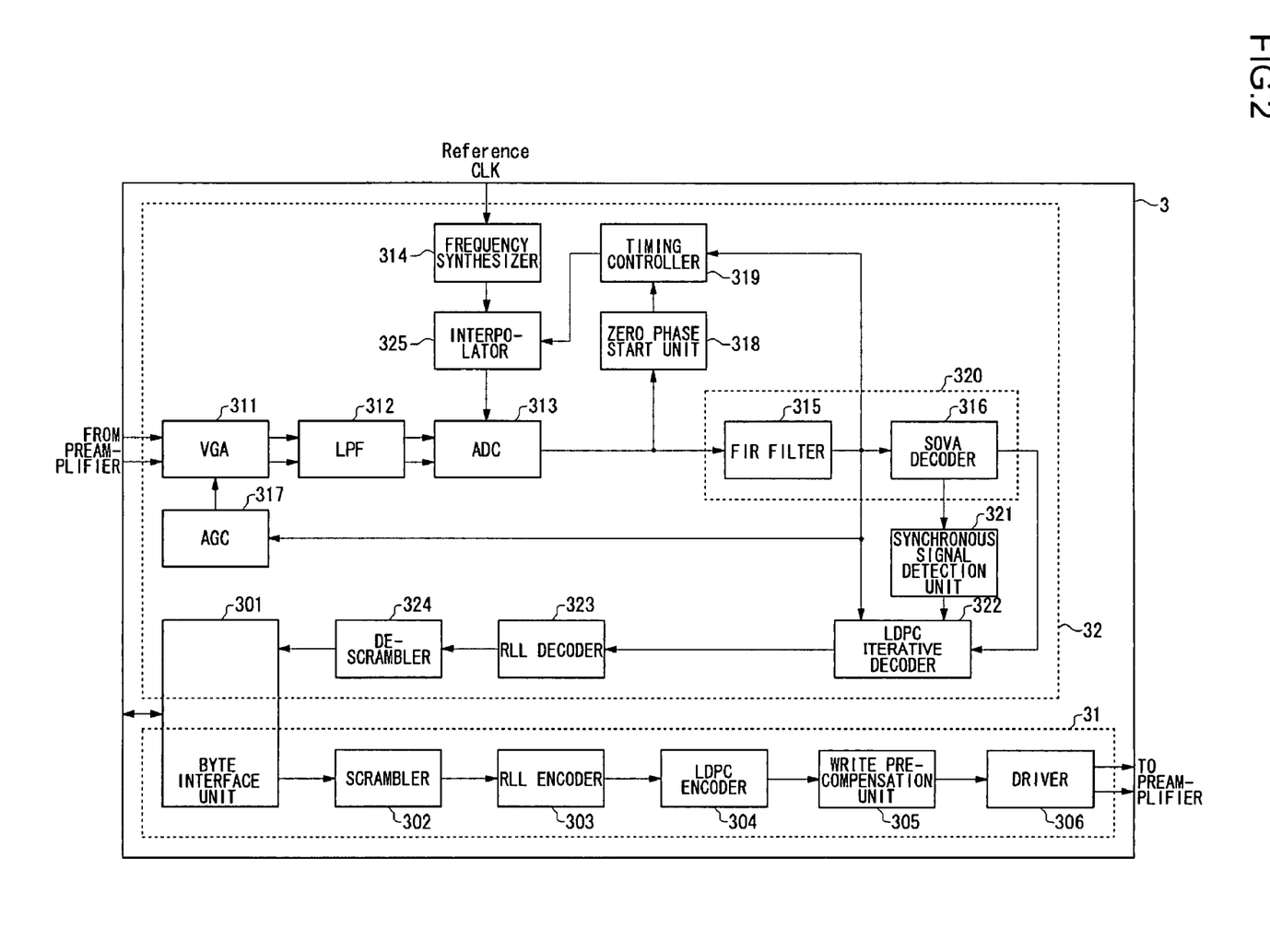
FIG. 2 is a view of a configuration of a read/write channel of the embodiment.

Here, the R/W channel 3 is explained, using FIG. 2. FIG. 2 shows a configuration of the R/W channel 3 of FIG. 1. The R/W channel 3, broadly divided, is configured from a write channel 31 and a read channel 32.

The write channel 31 includes a byte interface unit 301, a scrambler 302, a run-length control encoder 303 (below, abbreviated to a RLL encoder 303), a low density parity check encoder 304 (below, abbreviated to a LDPC encoder 304), a write compensation unit 305 (below, described as a write pre-compensation unit 305), and a driver 306.

The byte interface unit 301 processes, as input data, data transmitted from the HDC 1. Data writing on the media is input from the HDC 1 in one sector units. At this time, not only user data for one sector (512 bytes), but also ECC bytes added by the HDC 1 are inputted. A data bus is usually one byte (8 bits), and processing is carried out for data input by the byte interface unit 301. The scrambler 302 converts write data into a random series. This is to prevent repetition of the same data pattern that adversely affects detection performance at read time and causes deterioration in error rate. The RLL encoder 303 has a role of limiting the maximum continuous length of 0s. By limiting the maximum continuous length of 0s, a data series is formed that is suitable for an automatic gain control unit 317 (below, abbreviated to an AGC 317) or the like, at read time.

The LDPC encoder 304 has a role of encoding to a data series that is LDPC-encoded with redundant bits of LDPC code added to the data series. The LDPC encoding is performed by multiplying, from the left, a data series of length k, by a k×n matrix called a generator matrix. Each element included in this generator matrix is 0 or 1.

The write pre-compensation unit 305 is a circuit for compensating for non-linear distortion due to continuous magnetic transition on the media. A pattern necessary for compensation is detected from the write data, and a write current waveform is adjusted in advance so that the magnetic transition occurs at a correct position. The driver 306 is a driver for outputting a signal corresponding to a pseudo ECL level. Output from the driver 306 is sent to the DE 5, not illustrated in the figure, sent through the preamplifier 54 to the head 51, and the write data is recorded on the disk media 50.

The read channel 32 is configured from a variable gain amplifier 311 (below, abbreviated as a VGA 311), a low-pass filter 312 (below, abbreviated to a LPF 312), the AGC 317, an analog/digital converter 313 (below, abbreviated to an ADC 313), a frequency synthesizer 314, a FIR filter 315, a SOVA (Soft-Output Viterbi Algorithm) decoder 316, a zero phase start unit 318, a timing controller 319, an interpolator 325, an LDPC iterative decoder 322, a synchronous signal detector 321, a run-length control decoder 323 (below, abbreviated to RLL decoder 323), and a de-scrambler 324.

The VGA 311 and the AGC 317 perform adjustment of the amplitude of a read waveform of data send from the preamplifier 54, not shown in the figure. The AGC 317 compares the actual amplitude with an ideal amplitude, and determines gain to be set in the VGA 311. The LPF 312 can adjust cutoff frequency and boost amount, and handles part of equalization of partial response waveform (below, abbreviated to PR) and reduction of high frequency wave noise. In the LPF 312, equalization of the PR waveform is carried out, but complete equalization by analog LPF is difficult due to many causes, such as variation in rising of the head, non-uniformity of media, variation in rotation of motor, and the like. Accordingly, the FIR filter 315, disposed behind the LPF 312 and having more flexibility, is used, and the equalization of the PR waveform is repeated. The FIR filter 315 has a function of adaptively adjusting a tap coefficient thereof. The frequency synthesizer 314 generates a sampling clock for the ADC 313. The interpolator 325 uses a phase error detected by the timing controller 319, to perform fine adjustment of the sampling clock generated by the frequency synthesizer 314. The ADC 313 has a configuration to obtain a direct synchronous sample by AD conversion. In addition to this configuration, the configuration may obtain an asynchronous sample by the AD conversion. In such cases, an interpolation filter may be used instead of the interpolator 325. The zero phase start unit 318 is a block for determining an initial phase. The timing controller 319 uses output of the determined initial phase and the FIR filter 315, compares the actual sample value with an ideal sample value, and detects phase error.

The SOVA decoder 316 uses SOVA, which is a type of Viterbi algorithm, to avoid deterioration of decoding characteristic that accompanies intersymbol interference. That is, with the increase in recording density of magnetic disk devices in recent years, interference between recorded symbols has increased, and in order to solve the problem of deterioration of decoding characteristic, a maximum-likelihood decoding (Partial Response Maximum Likelihood; abbreviated to PRML below) system is used as a system to overcome this. The PRML system is composed of two systems, a PR system and an ML system, and is a system for obtaining a signal series that maximizes likelihood of a partial response due to inter-symbol interference of reproduced signals. As shown in FIG. 2, a PRML decoder 320 includes the FIR filter 315 and the SOVA decoder 316. Output from the SOVA decoder 316 can be used as a soft input value of the LDPC iterative decoder 322. For example, soft values (0.71, 0.18, 0.45, 0.45, 0.9) are the output of the SOVA. These values express, as a numerical value, the probability of 0 being large, or a probability of 1 being large. For example, the first value of 0.71 indicates that the probability of 1 is large, and the fourth value of 0.45 means that the probability of 0 is large but the probability of 1 is also not small. Output of a conventional Viterbi detector is a hard value, and is a hard determination of the SOVA output. Here, the hard determination, for example, with a value larger than a prescribed threshold value, is judged to be "1", and with a small value, is judged to be "0". In the case of the abovementioned example, this is (1, 0, 0, 0, 1). The hard value is only expressed as being 0, or as being 1, and information indicating which has a higher probability is lost. As a result, with input of the soft value to the LDPC iterative decoder 322, decoding performance is better.

The synchronous signal detection unit 32 detects a sync mark added to the head of the data, and has a role of recognizing the head position of the data. The LDPC iterative decoder 322 has a role of decoding from the data series that is LDPC-encoded, to a series before the LDPC encoding. Methods of decoding include, principally, a sum-product decoding method, and a min-sum decoding method. In an aspect of decoding performance, the sum-product decoding method is advantageous, but the min-sum decoding method has a characteristic in being easy to implement with hardware.

In general, when using iterative decoding in LDPC decoding, values known as a priori probability and a posteriori probability are obtained, and in addition, the priori probability and the posteriori probability are recalculated, via a DAE. At a prescribed number of repetitions, or when it is judged that an error is no longer included, a hard decision is made of the likelihood at that point in time, and decoded data of two values are output. The non-inclusion of an error means that a transposed matrix of the check matrix (parity check matrix) is multiplied by decoded data including a redundant data series, and a judgment is made as to whether or not the result is a 0 matrix. If the generator matrix is G and the check matrix (parity check matrix) is H, the check matrix (parity check matrix) is one such that $GH^T=0$. As described above, the LDPC encoding is formed by multiplying the data series from the left, by the generator matrix, and adding a redundant bit to the data series. That is, if the result of multiplying the transposed matrix of the check matrix (parity check matrix) by the decoded data is a 0 matrix, it is judged that due to corrections there is no error in the decoded data. In addition, if the result is not a 0 matrix, it is judged that an error that has not been corrected is included in the decoded data. As another method of judging that other errors are not included, among the data that is an object of decoding, the generator matrix used in LDPC encoding is multiplied by the data series outside of the redundant data series, to obtain the redundant bits. Next, a hard decision of the redundant bits is made, a comparison with the redundant data series is done, and according to whether or not there is a match, a judgment is made as to whether the errors have been corrected.

The RLL decoder 323 performs an operation the reverse of the RLL encoder of the write channel 31, on data outputted from the LDPC iterative decoder 322, to return the original data series. The de-scrambler 324 performs an operation the reverse of the scrambler 302 of the write channel 31, to return the original data series. The data generated here is transmitted to the HDC 1.

Figure 3:
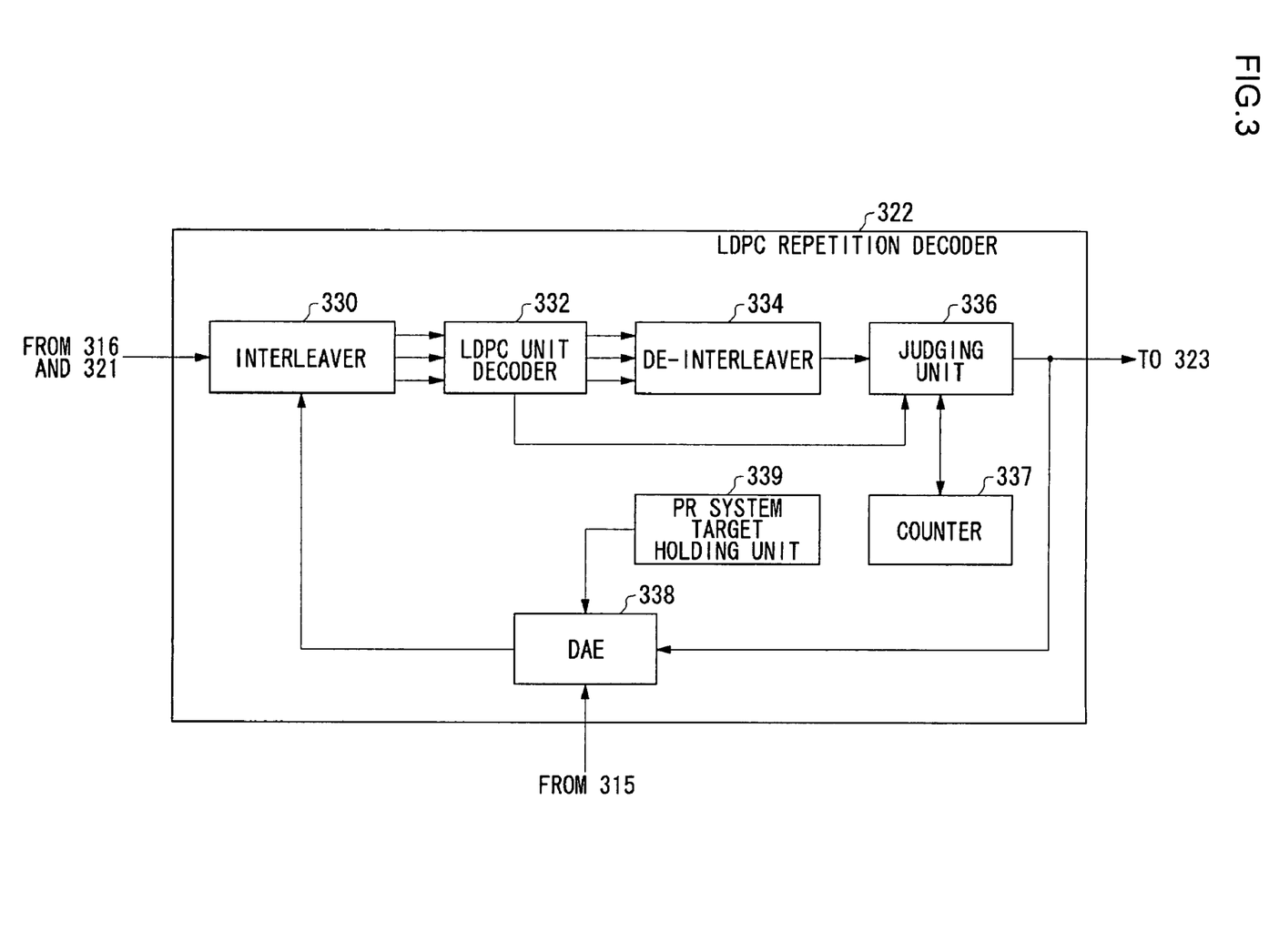
FIG. 3 is a functional block diagram of an LDPC iterative decoder of the embodiment.

FIG. 3 is a functional block diagram of the LDPC iterative decoder 322. The LDPC iterative decoder 322 includes an interleaver 330, an LDPC unit decoder 332, a de-interleaver 334, a judging unit 336, a counter 337, the DAE 338, and a PR system target holding unit 339.

The soft value data decoded by the SOVA decoder 316 is inputted to the interleaver 330 after the head position of the data is recognized by the synchronous signal detector 321. The interleaver 330 interleaves the inputted data, to divide it into a plurality of paths. "Interleaving" is sorting continuous data of a data series into a plurality of levels. Operation of the interleaver 330 is explained here. In general, in the PRML system, it is known that burst errors easily occur. When the LDPC unit decoder 332 applies the check matrix (parity check matrix) to the data series, if a column having a linearly dependent relationship is multiplied by the check matrix (parity check matrix) at positions at which burst errors occur in the data series, there are cases in which these burst errors cannot be detected. In particular, for elements of the check matrix (parity check matrix) used in the LDPC decoding, since the number of is small in comparison to the number of 0s, columns having linearly dependent relationships are easily included, and the probability that burst errors cannot be detected is relatively high. By dividing the data into the plurality of paths, the interleaver 330 disperses the errors to various paths, and the accuracy of error detection is raised, when multiplication by the check matrix (parity check matrix) is done.

However, in cases in which the number of locations of errors forming the burst errors is large, and even with interleaving, the burst errors are present, there are cases in which those burst errors cannot be detected by the composition of the check matrix (parity check matrix). As an example, it is assumed that there are errors at 32 continuous locations in the data before being interleaved, and that the interleaver 330 divides the locations at which the errors occur, into eight paths. As a result thereof, for the data sorted into the various paths, the errors are present at four continuous locations. Here, in the check matrix (parity check matrix) four columns with a linearly dependent relationship are mutually adjacent, and if errors at four continuous locations, that are respectively included in data sorted into the various paths, are multiplied, these errors are not detected. In such cases, by composing the check matrix (parity check matrix) with the linearly dependent columns non-adjacent, as described below, it is possible to detect burst errors that are present even after interleaving.

The LDPC unit decoder 332 performs LDPC decoding on data divided into a plurality of paths by the interleaver 330, and together with outputting the decoded data as temporary estimated values, performs a parity check on the temporary estimated values. Here, the LDPC unit decoder 332 makes a hard decision of soft values inputted in a first decoding, and outputs the temporary estimated values as hard values. If the temporary estimated values are taken as x and the check matrix (parity check matrix) as H, a "parity check" multiplies the temporary estimated values x by the transposed matrix $H^T$ of the check matrix (parity check matrix) H, and examines whether or not the relationship $xH^T=0$ is true. By performing parallel processing on data divided into a plurality of paths by the interleaver 330, the LDPC unit decoder 332 realizes high speed processing. The de-interleaver 334 de-interleaves the temporary estimated values decoded by the LDPC unit decoder 332 and outputted, and returns them to a form of one of the original data series. In FIG. 3, the plurality of paths between the interleaver 330 and the LDPC unit decoder 332, and between the LDPC unit decoder 332 and the de-interleaver 334, are shown by three arrows. Here, "de-interleaving" means integrating data interleaved and sorted into the plurality of paths, and rearranging into an original format.

The judging unit 336 judges whether or not iterative decoding is finished, according to a result of the parity check. The counter 337 counts the number of times that decoding has been repeated. That is, 1 is added to the counter 337 every time the judging unit 336 makes a judgment. Here, when $xH^T=0$ is realized for the result of the parity check, or when $xH^T=0$ is not realized but the counter 337 has counted to a number of decoding repetitions decided in advance (also described as a "prescribed number of times"), the judging unit 336 judges that the iterative decoding is finished. On the other hand, when $xH^T=0$ is not realized for the result of the parity check, and the counter 337 has not counted to the prescribed number of times, the judging unit 336 judges that the iterative decoding has not finished. When it has judged that the iterative decoding is finished, the judging unit 336 outputs the temporary estimated values to the RLL decoding unit 323. On the other hand, when it is not judged that the iterative decoding has finished, the judging unit 336 outputs the temporary estimated values to the DAE 338. That is, the judging unit 336 does not add processing to the temporary estimated values de-interleaved by the de-interleaver 334, but outputs these temporary estimated values to the RLL decoding unit 323 or the DAE 338. The DAE 338 uses the de-interleaved temporary estimated values, the output of the FIR filter 315 and the target value (also described as a "PR system target") of a waveform equivalent of data by the PR system that the PR system target holding unit 339 holds, to compute a logarithm likelihood ratio. In the present embodiment, the temporary estimated values used at this time are hard values, but may also be soft values before a hard decision. Here, the "logarithm likelihood ratio" is confidence information for a temporary estimated value symbol. For second and subsequent iterative decoding, the logarithm likelihood ratio computed by the DAE 338 is used. That is, the interleaver 330 interleaves the logarithm likelihood ratio which is the output of the DAE 338. The LDPC unit decoder 332 performs LDPC decoding with regard to the logarithm likelihood ratio interleaved by the interleaver 330, outputs this decoded data as temporary estimated values, and performs a parity check on these temporary estimated values.

Figure 4:
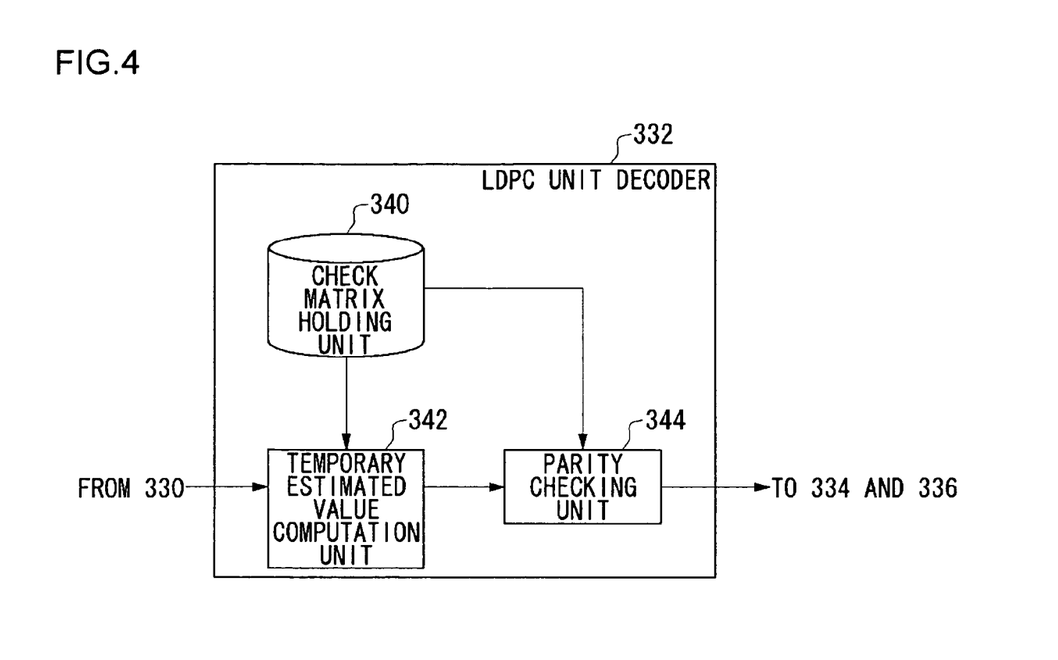
FIG. 4 is a functional block diagram of an LDPC unit decoder of the embodiment.

FIG. 4 is a functional block diagram of the LDPC unit decoder 332. In the present embodiment the min-sum decoding method is used to carry out decoding. Here, decoding may also be done by the sum-product decoding method. A temporary estimated value computation unit 342 decodes signals interleaved by the interleaver 330. Decoding by the temporary estimated value computation unit 342 uses a logarithm external value ratio of each element of the check matrix (parity check matrix) held by a check matrix (parity check matrix) holding unit 340, a logarithm priori probability ratio, and a logarithm likelihood ratio, to perform repeated calculation of the temporary estimated value of a signal, a prescribed number of times. Here, the temporary estimated value computation unit 342 makes a hard decision of soft values inputted in the first decoding, and outputs the temporary estimated values as hard values. A parity checking unit 344 performs error detection by parity checking of the temporary estimated values computed by the temporary estimated value computation unit 342. The parity checking is performed by multiplying the temporary estimated values by the transpose matrix of the check matrix (parity check matrix) held by the check matrix (parity check matrix) holding unit 340. Specifically, if the temporary estimated values are x and the check matrix (parity check matrix) is H, the parity checking unit 344 performs the multiplication $xH^T$. When implemented in a circuit, a multiplier is used as the parity checking unit 344. The temporary estimated values that are objects of the multiplication are outputted from the parity checking unit 344 and are inputted to the de-interleaver 334. In addition, a result of the multiplication in the parity checking unit 344 is inputted to the judging unit 336. Here, the "logarithm external value ratio" is an increment of a symbol confidence factor with decoding. The "logarithm priori probability ratio" is a value given in advance for computing the logarithm external value ratio.

Figure 5:
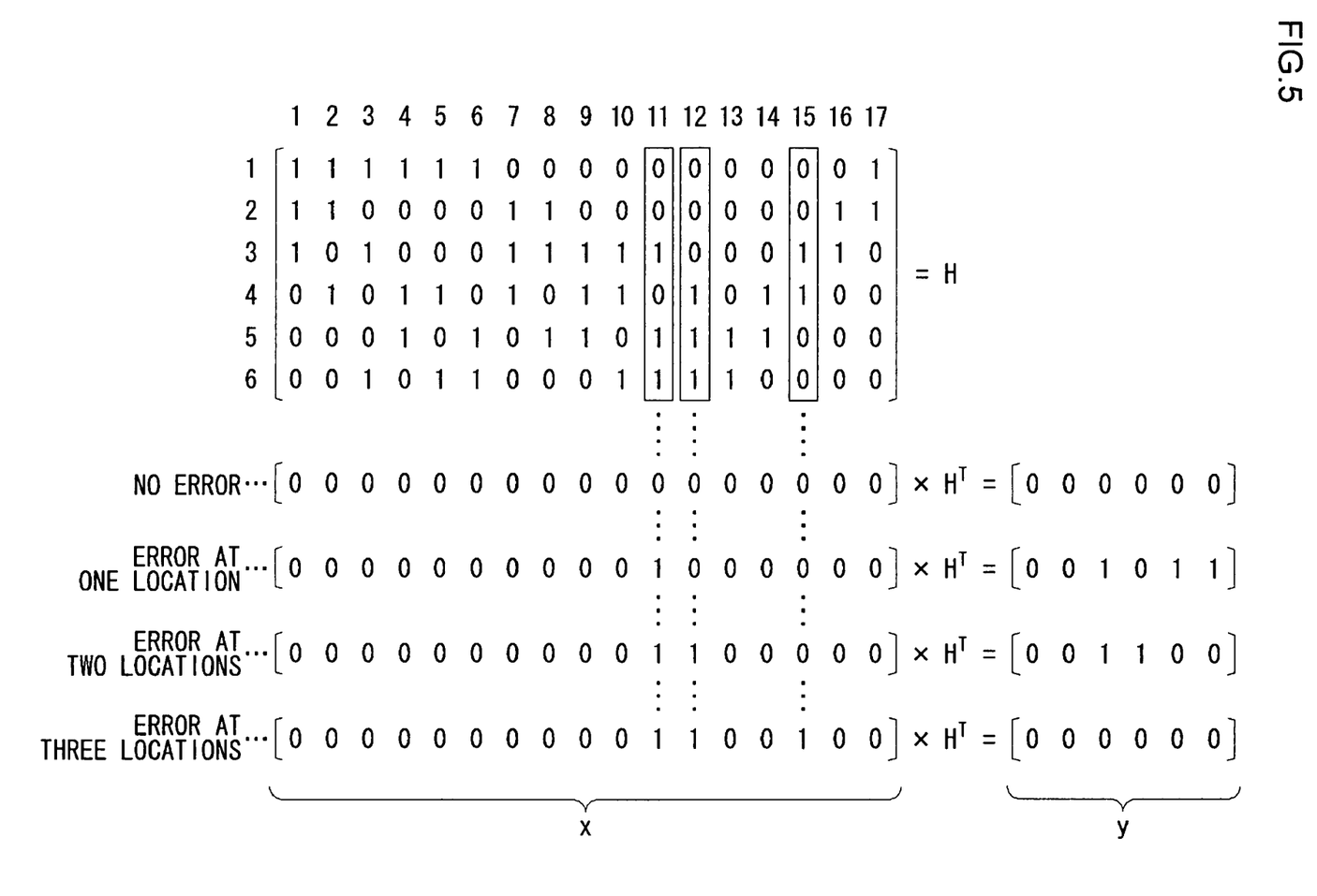
FIG. 5 is a view explaining error detection.

FIG. 5 is a view explaining error detection. Here, an explanation is given concerning when all linearly dependent columns included in the check matrix (parity check matrix) are multiplied at error occurrence locations, so that error detection becomes impossible. In the same figure, if the temporary estimated values are x and the check matrix (parity check matrix) is H, a result of the multiplication $xH^T$ with respect to the parity check is y. The temporary estimated values x are a 17 bit data series, and the same figure describes a matrix with 1 row and 17 columns. The check matrix (parity check matrix) H is a matrix with 6 rows and 17 columns, and a matrix y with 1 row and 6 columns is obtained as a result of $xH^T$ multiplication. A row number is shown for each row and a column number is shown for each column in the check matrix (parity check matrix) H. Here, it can be stated that when all elements of the multiplication result y are "0", an error has not occurred, and when any of the elements is "1", an error has occurred. In the present embodiment, original data before being encoded is taken as a matrix of 1 row and 17 columns in which all of the elements are "0". In the same figure, a linearly dependent relationship is realized by 3 columns in the check matrix (parity check matrix) H, shown enclosed by a frame, that is, the $11^{th}$ column, the $12^{th}$ column, and the $15^{th}$ column.

When an error has not occurred in the temporary estimated values x, that is, when all elements of the temporary estimated values x are "0", elements of the multiplication result y are all "0", i.e., "0 0 0 0 0 0". When an error has occurred at one location in the temporary estimated values x, and the element in the $11^{th}$ column is "1", the multiplication result y is "0 0 1 0 1 1". In this case, since "1" is included in elements of the multiplication result y, a judgment can be made that an error has occurred. If errors occur at two locations in the temporary estimated values x, and elements of the $11^{th}$ column and the $12^{th}$ column are "1", the multiplication result y is "0 0 1 1 0 0". In this case also, since "1" is included in elements of the multiplication result y, a judgment can be made that errors have occurred. If errors occur at three locations in the temporary estimated values x, and elements of the $11^{th}$ column, the $12^{th}$ column, and the $15^{th}$ column are "1", the multiplication result y is "0 0 0 0 0 0". In this case, a multiplication result y is obtained that is the same as cases in which an error has not occurred in the temporary estimated values x, and a judgment cannot be made that an error has occurred. This is due to all the linearly dependent columns being multiplied by the elements "1" at the locations where an error occurs. This is explained below, using FIG. 6.

FIG. 6 is a view in which locations at which errors occur are extracted from the matrix shown in FIG. 5. Matrix α is a matrix composed by extracting the $11^{th}$ column, $12^{th}$ column, and $15^{th}$ column of the temporary estimated values x; matrix β is a matrix composed by extracting linearly dependent columns, the $11^{th}$ column, $12^{th}$ column, and $5^{th}$ column of the check matrix (parity check matrix) H; matrix γ is a result of the multiplication $\alpha \beta^T$. The three columns composing matrix β are in a linearly dependent relationship. That is, in each row of the matrix β, elements "1" are not present, or are present at two locations, and if these three columns are added, a matrix of 6 rows and 1 column in which all elements are "0" is obtained.

If the multiplication $\alpha \beta^T$ is done, by respectively multiplying and then adding each element of the matrix α, and each element of each column of the transpose $\beta^T$, that is, each row of the matrix β, each element of the multiplication result γ is computed. FIGS. 6A, 6B, 6C, and 6D respectively show the matrix α, the matrix β, and the multiplication result γ, for a case in which no error occurs, a case in which one error occurs, a case in which two errors occur, and a case in which three errors occur, in the temporary estimated values x. Furthermore, arrows shown in FIGS. 6A, 6B, 6C, and 6D indicate that the various rows of the matrix α at the origin of the arrows, as a result of multiplication, are related to determination of values of respective elements in the multiplication result γ at the end of arrows.

Figure 6A:
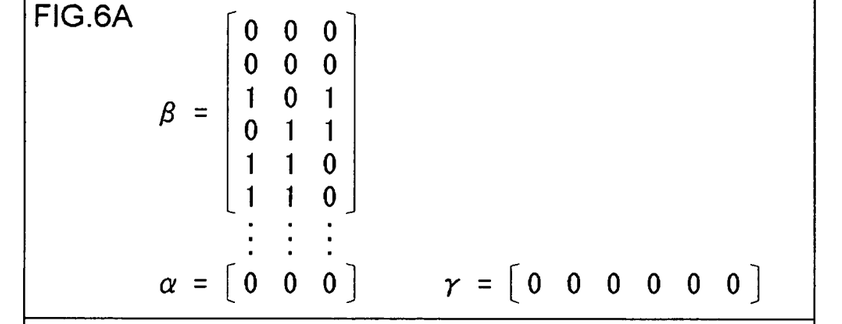
FIG. 6A is a view of a portion extracted from FIG. 5 in cases in which an error does not occur.
Figure 6B:
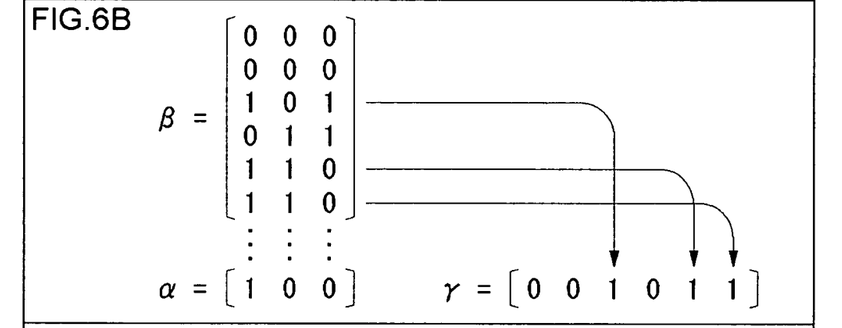
FIG. 6B is a view of a portion extracted from FIG. 5 in cases in which an error has occurred in one location.

In cases in which an error does not occur in the temporary estimated values x, the elements "0" of each column of the matrix α are multiplied by elements of each row of the matrix β, and the multiplication result γ is "0 0 0 0 0 0" as shown in FIG. 6A. In cases in which an error occurs at one location in the temporary estimated values x and the $1^{st}$ column of the matrix α is "1", this element "1" is multiplied by elements in each row in the $1^{st}$ column of the matrix β. Since the element of the $1^{st}$ column of this matrix β is "1" at the $3^{rd}$ row, the $5^{th}$ row, and the $6^{th}$ row, the elements of the $3^{rd}$ column, the $5^{th}$ column, and the $6^{th}$ column of the multiplication result γ "0 0 0 0 0 0" when an error does not occur, is a inverse result, and is "0 0 1 0 1 1" as shown in FIG. 6B. Due to this, the multiplication result y is also "0 0 1 0 1 1", as shown in FIG. 5 and described above. Here, "inverse" indicates that an element "0" becomes "1", or that an element "1" becomes "0".

Figure 6C:
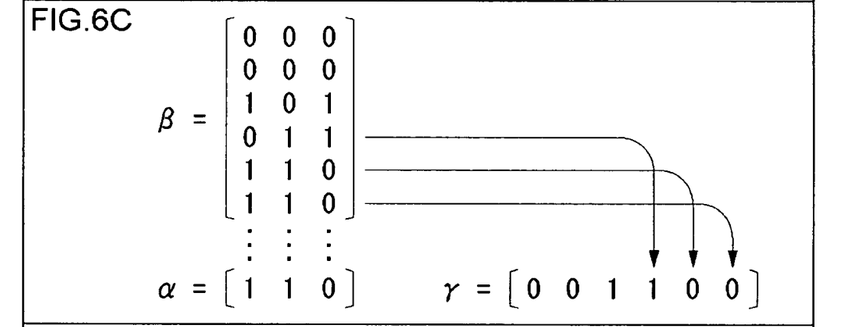
FIG. 6C is a view of a portion extracted from FIG. 5 in cases in which errors have occurred in two locations.

An error occurs at two locations in the temporary estimated values x, and in addition to the first column of the abovementioned matrix α, an element of the second column also is "1". At this time, the elements "1" of the first column of the matrix α are multiplied by the elements of each row of the first column of matrix β, and the elements "1" of the second column of the matrix α are multiplied by the elements of each row of the second column of matrix β. Since the elements of the second column of the matrix β are "1" at the $4^{rd}$ row, the $5^{th}$ row, and the $6^{th}$ row, the elements of the $4^{rd}$ column, the $5^{th}$ column, and the $6^{th}$ column of the multiplication result γ "0 0 1 0 1 1" when an error occurs at one location, is a inverse result, and is "0 0 1 1 0 0" as shown in FIG. 6C. Due to this, the multiplication result γ is also "0 0 1 1 0 0", as shown in FIG. 5 and described above.

Figure 6D:
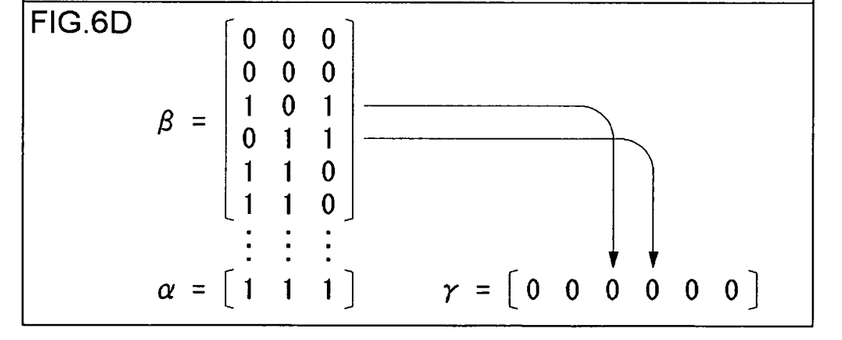
FIG. 6D is a view of a portion extracted from FIG. 5 in cases in which errors have occurred in three locations.

An error occurs at three locations in the temporary estimated values x, and in addition to the first column and the second column of the abovementioned matrix α, an element of the third column also is "1". At this time, the elements "1" of the first column of the matrix α are multiplied by the elements of each row of the first column of matrix β. In the same way, the elements "1" of the second column of the matrix α are multiplied by the elements of each row of the second column of matrix β, and the elements "1" of the third column of the matrix α are multiplied by the elements of each row of the third column of matrix β. Since the elements of the third column of the matrix β are "1" at the third row and the fourth row, the elements of the third column and the fourth column of the multiplication result γ "0 0 1 1 0 0", when an error occurs at two locations, are inversed, and the result becomes "0 0 0 0 0 0", as shown in FIG. 6D. Due to this, the multiplication result y is also "0 0 0 0 0 0", as shown in FIG. 5 and described above, and with this result, detection of an error is not possible.

When an error occurs at three locations of the temporary estimated values x, the multiplication result γ is "0 0 0 0 0 0" due to "1" being present at two locations in each of the third row, the fourth row, the fifth row, and the sixth row or the matrix β. That is, if an element "1" is at a location at which an error occurs and at a multiplied location in the matrix a "0" or a "1" is inverted in a column of the multiplication result γ corresponding to a row where the elements "1" are present. Here, since "1" is present at two locations in the third row, the fourth row, the fifth row, and the sixth row of the matrix β, elements of the third column, the fourth column, the fifth column, and the sixth column of the multiplication result γ, when errors occur at three locations, are inversed twice and become "0". That is, when all linearly dependent columns at locations where errors occur are multiplied, error detection becomes impossible. In the present embodiment, an explanation is given for cases in which errors occur in the original data at locations where "0" is present, which become "1". Even in cases in which errors occur at locations that were "1" in the original data and become "0", there is no change in that the "1" and the "0" elements in the multiplication result are inversed, and the explanation is the same as that described above.

As a method of eliminating the problem that these errors cannot be detected, by including, in the check matrix (parity check matrix), as large a number as possible of columns in which a linearly dependent relationship is established, it is considered that the number of errors that can be detected is increased. However, since the check matrix (parity check matrix) is a sparse matrix with fewer "1"s than "0"s, linearly dependent relationships are established easily, and there is a limit to the number of columns in which linearly dependency can be established.

Here, at no matter which locations errors occur, if a check matrix (parity check matrix) is composed by arranging linearly dependent columns so that all the linearly dependent columns at those locations are not multiplied, detection of errors is possible. A method of composing this type of check matrix (parity check matrix) in the present embodiment is explained below.

Figure 7:
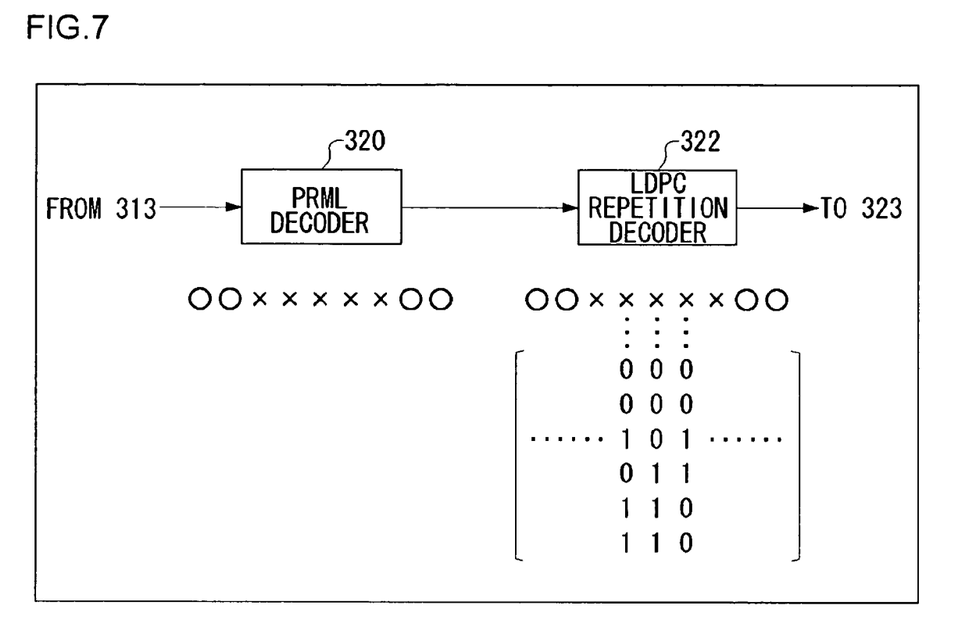
FIG. 7 is a view showing a correspondence relationship with an error occurrence position in cases in which linearly dependent columns are set out adjacently in a check matrix (parity check matrix)
Figure 8:
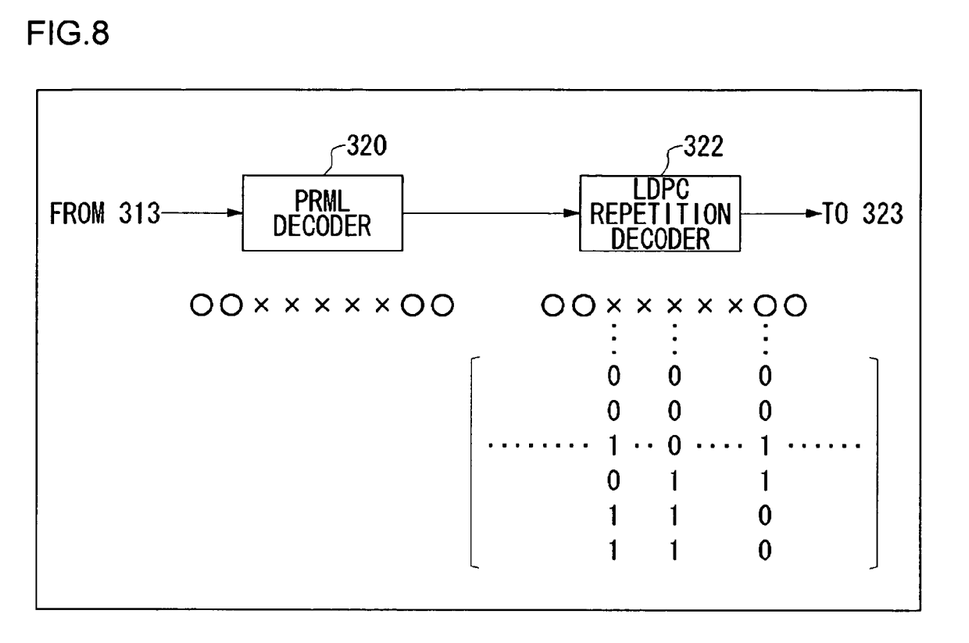
FIG. 8 is a view showing a correspondence relationship with an error occurrence position in cases in which linearly dependent columns are set out non-adjacently in the check matrix (parity check matrix)

Using FIG. 7 and FIG. 8, the concept of composing the check matrix (parity check matrix) of the present embodiment is explained. Here, the composition of the check matrix (parity check matrix) for detecting the burst errors is explained. FIG. 7 and FIG. 8 are views that focus on the PRML decoder 320 and the LDPC iterative decoder 322 shown in FIG. 2. The PRML decoder 320 performs PRML decoding of data reproduced from the disk media 50 shown in FIG. 1. As described above, in general, the burst errors occur easily in data that has been PRML-decoded. The LDPC iterative decoder 322 applies the check matrix (parity check matrix) to the data that has been PRML-decoded.

In FIG. 7 and FIG. 8, columns indicated by ○ and X shown below the PRML decoder 320 and the LDPC iterative decoder 322 are part of a data series that is PRML decoded. ○ indicates locations in the data series where errors have not occurred due to the PRML decoding, and X indicates locations where errors have occurred due to the PRML decoding. As shown in FIG. 7 and FIG. 8, in the data decoded by the PRML decoding, the burst errors have occurred continuously in five locations. The matrix shown below the LDPC iterative decoder 322 is a check matrix (parity check matrix). In FIG. 7 and FIG. 8 three columns included in the check matrix (parity check matrix) are shown. These three columns have a linearly dependent relationship. In the check matrix (parity check matrix), outside of these three columns, combinations of columns that are linearly dependent are not present. In FIG. 7, these three columns are arranged to be mutually adjacent. On the other hand, in FIG. 8, these three columns are arranged at positions that are mutually non-adjacent.

In FIG. 7, when the check matrix (parity check matrix) is applied to a signal, these three columns correspond respectively to locations at which data is marked with the X, shown linked by a dotted line, that is, locations at which errors occur. Briefly, in the LDPC iterative decoder 322 all the linearly dependent columns included in the check matrix (parity check matrix) are multiplied at the locations where errors occur. As described above, in this case, these errors cannot be detected.

On the other hand, in FIG. 8 the three linearly dependent columns are arranged at positions that are mutually non-adjacent in the check matrix (parity check matrix), and among the three linearly dependent columns, two columns correspond to locations at which errors occur, and the other column corresponds to a location at which an error does not occur. Briefly, columns that are mutually linearly independent, that is, columns that are not linearly dependent, are arranged at five locations corresponding to locations where errors occur in the check matrix (parity check matrix). In this case, since all of the linearly dependent columns are not multiplied at locations at which errors occur, detection of errors becomes possible. Briefly, if the check matrix (parity check matrix) is composed such that, among columns equal in number to the number of continuous errors in the burst errors, so that no linearly dependent columns are included, by arranging these columns to be mutually non-adjacent, the burst errors can be detected.

Positions at which the linearly dependent columns are arranged in the check matrix (parity check matrix) can be determined according to a characteristic of the burst errors. For example, in cases in which data, recorded in the disk media 50 by a longitudinal recording method or by a perpendicular magnetic recording method, is decoded by the PRML decoding method, in general, among the burst errors occurring in the decoded data, it is known that the number of bits of continuous errors is usually 10 bits or less. At this time, by composing the check matrix (parity check matrix) with the linearly dependent columns arranged so that no linearly dependent columns are included among 10 columns that are adjacent, it is possible to detect most of the burst errors occurring in signals decoded by the PRML decoding.

Furthermore, even if all error patterns cannot be detected, it is possible to compose the check matrix (parity check matrix) by setting an allowable range for an error detection result, so that error detection results are within that allowable range. For example, in the data that is PRML decoded as described above, occurrence of the burst errors of a long pattern, such as 10 bits, is rare, and among all the errors that occur, about 90% of the errors have error patterns of the order of 5 bits. Here, if these errors can be detected, the detection result is allowable. Consequently, the check matrix (parity check matrix) is composed so that all error patterns within 5 bits are detected, and all linearly dependent columns are not included in five columns that are adjacent. In this way, in order to also detect long error patterns of 9 bits and 10 bits that have a low frequently of occurrence, in comparison to cases of composing the check matrix (parity check matrix) so that all linearly dependent columns are not included in 10 columns that are adjacent, it is possible to easily compose the check matrix (parity check matrix). In addition, by using the check matrix (parity check matrix) composed in this way, it is possible to obtain an allowable error detection result, and a high level of accuracy of error detection can be assured.

Using FIG. 9, a composition method for the check matrix (parity check matrix) as described above will be explained. Here, the object is to detect the burst errors of 5 bits or less. That is, among five mutually adjacent columns with respect to any location in the check matrix (parity check matrix), it is necessary that all the linearly dependent columns not be included. First, a block is formed such that all of the linearly dependent columns are not included in the five adjacent columns. Next, the check matrix (parity check matrix) is composed by repeating an operation of sequentially linking in a columnar direction a block in which the above block is cyclically shifted in a row direction. Here, all of the linearly dependent columns are not included among the five columns that straddle the border of each block. In one round of the cyclic shift, the block first composed is linked, and the operation is repeated to sequentially link blocks that have been cyclically shifted the same as in the first round, until the number of columns in the check matrix (parity check matrix) has been reached.

Figure 9:
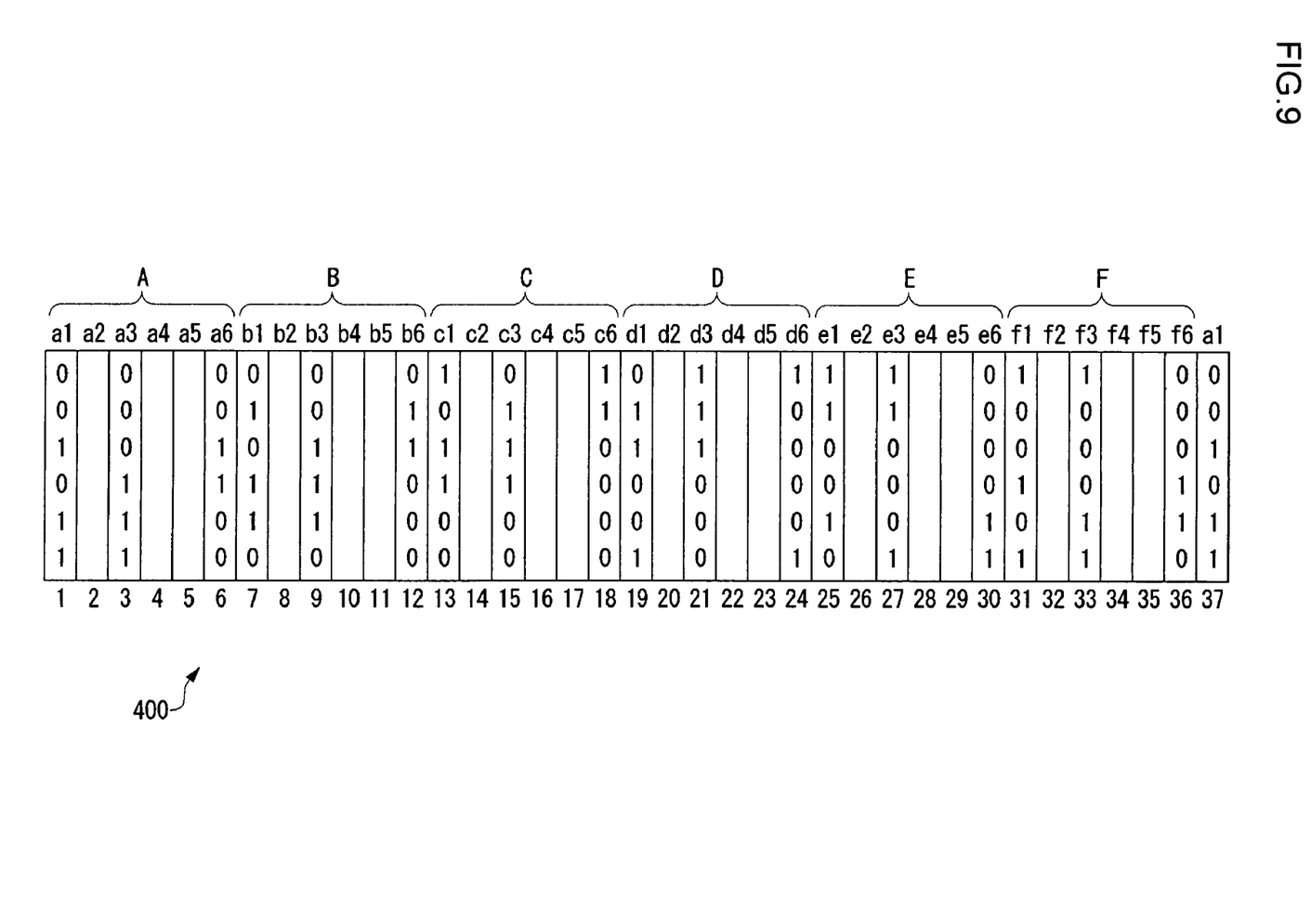
FIG. 9 is a view explaining a composition method of a check matrix (parity check matrix) of the embodiment.

FIG. 9 is a view showing the check matrix (parity check matrix) composed by this method. The check matrix (parity check matrix) 400 is a matrix of 6 rows and 37 columns, and is formed of six blocks, A, B, C, D, E, and F, and one column, a1. In addition, as shown in the same figure, the block A is composed of six columns, a1, a2, a3, a4, a5, and a6. In the same way, blocks B to F are composed, respectively, of six columns b1 to b6, c1 to c6, d1 to d6, e1 to e6, and f1 to f6. Moreover, in the same figure, column numbers are shown below the check matrix (parity check matrix) 400.

A procedure for composing the check matrix (parity check matrix) will be explained. First, the six columns, a1 to a6, are set out in a columnar direction to form the block A. Here, a1, a3, and a6 are linearly dependent columns. Furthermore, in the block A, a linearly dependent relationship is not established outside of these three columns. When a1 to a6 are set out, as shown in the same figure, all three of these linearly dependent columns are not included in the five adjacent columns and are arranged to be non-adjacent. Next, the block A is given a cyclic shift in a row direction, to form the block B, and is arranged to be linked with the final column a6 of the block A. Since the block A is given a cyclic shift in the row direction, the elements of the first row of the block A correspond to elements of the sixth row of the block B. In addition, rows 2 to 5 of the block A correspond to the first row to the fifth row of the block B. That is, b1, b3, and b6 are a1, a3, and a6 respectively cyclically shifted in the row direction. a1, a3, and a6 are linearly dependent columns, and b1, b3, and b6, which are cyclically shifted therefrom in a row direction, also are linearly dependent columns. That is, in the block B also, the linearly dependent columns b1, b3, and b6 are not included in the adjacent five columns. In addition, for example, in the five columns from the sixth column to the tenth column, a6, b1, and b3 straddle and are included in the block A and the block B, but since the blocks are composed, paying attention to the borders of the blocks, a linearly dependent relationship is not established between these columns.

In the same way, an operation is repeated to cyclically shift and link the blocks C to F sequentially in a row direction. In a state in which the blocks A to F are linked, a matrix of 6 rows and 36 columns is composed. Then, a1, which is the first column of the block A is arranged as the 37$^{th}$ column of the check matrix (parity check matrix) 400. In the check matrix (parity check matrix) 400 composed by the above procedure, among five adjacent columns at any location, all linearly dependent columns are not included. In this way, for a burst error up to 5 continuous bits, occurrence of the burst error can be detected.

In the method of composing the check matrix (parity check matrix) 400 of the present embodiment, if the composing is done so that, among 6 columns forming each block, all linearly dependent columns are not included in five adjacent columns thereof, according to the abovementioned prescribed procedure the check matrix (parity check matrix) 400 can be composed. In this way, since it is not necessary to consider a composition in which all the linearly dependent columns are not included in the five adjacent columns for all columns in the check matrix (parity check matrix) 400, the check matrix (parity check matrix) 400 can be easily composed.

In the present embodiment, each block included in the check matrix (parity check matrix) includes a linearly dependent column, but as a modified example, a linearly dependent column may not be included in each block, and linearly independent columns only may be included. In this way, since the columns in the check matrix (parity check matrix) are all formed from linearly independent columns, an operation of arranging the linearly dependent columns to be non-adjacent can be omitted.

In the present embodiment, in order to explain the detection of the burst errors, linearly independent columns were arranged to be adjacent. However, the errors detected are not limited thereby. If the check matrix (parity check matrix) is composed by arranging the linearly independent columns at locations with a high frequency of error occurrence, error detection is possible for signals in which errors occur easily and cyclically. In addition, by including in the check matrix (parity check matrix) as many columns as possible in which linearly dependent relationships are established, many errors can be detected.

In the present embodiment, an example has been explained in which a signal decoding device related to the present invention is applied to decoding of LDPC encoding; however, applications are not limited thereto, and if decoding using matrices is concerned, the invention can be applied.

The present embodiment has been explained with an example applied to the magnetic disk device; however, applications are not limited thereto, and for storage devices for storing encoded signals such as optical disk storage devices, opto-magnetic disk storage devices and the like, the invention is applicable where decoding is done when signals are read. In addition, application is possible to communication systems for decoding when a signal that has been encoded and transmitted is received.

What is claimed is:

1. A signal decoding device comprising a unit decoder for performing, when an input signal series is acquired and the input signal series is decoded, multiplication of the signal series, that is decoded, by a matrix;

wherein if s and t are natural numbers, with $s \geq t \geq 2$, the unit decoder uses the matrix in which, among s columns extracted from the matrix, t columns or less have a linearly independent relationship, and the s columns are multiplied by a signal in which error occurrence frequency is relatively high in the decoded signal series; and wherein the value of the t is decided based on a tolerance limit of an error occurring in the signal belonging to the decoded signal series, that cannot be detected when decoding.

2. A signal decoding device comprising a unit decoder for performing, when an input signal series is acquired and the input signal series is decoded, multiplication of the signal series, that is decoded, by a matrix;

wherein if s and t are natural numbers, with $s \geq t \geq 2$, the unit decoder uses the matrix in which, among s columns extracted from the matrix, t columns or less have a linearly independent relationship, and the s columns are multiplied by a signal in which error occurrence frequency is relatively high in the decoded signal series; and wherein the unit decoder decodes the encoded signal using a low density parity check code.

3. A signal decoding device comprising a unit decoder for performing, when an input signal series is acquired and the input signal series is decoded, multiplication of the signal series, that is decoded, by a matrix;

wherein, if s and t are natural numbers, with $s \geq t \geq 2$, the unit decoder uses the matrix in which, among s columns extracted from the matrix, t columns or less have a linearly independent relationship, and the s columns are adjacent in the matrix; and wherein the value of the t is decided based on a tolerance limit of an error occurring in the signal belonging to the decoded signal series, that cannot be detected when decoding.

4. A signal decoding device comprising a unit decoder for performing, when an input signal series is acquired and the input signal series is decoded, multiplication of the signal series, that is decoded, by a matrix;

wherein, if s and t are natural numbers, with $s \geq t \geq 2$, the unit decoder uses the matrix in which, among s columns extracted from the matrix, t columns or less have a linearly independent relationship, and the s columns are adjacent in the matrix; and wherein the unit decoder decodes the encoded signal using a low density parity check code.

5. A signal decoding device comprising a unit decoder for performing, when an input signal series is acquired and the input signal series is decoded, multiplication of the signal series that is decoded, by a matrix of m rows and n columns, m and n being natural numbers, with m and $n \geq 2$, wherein, the matrix includes a first and a second partial matrix of m rows and s columns, s being a natural number, with n>s, linked in a columnar direction, and, in the first and the second partial matrices, among the s columns thereof, t columns or less, t being a natural number, with $s \geq t \geq 2$, have a linearly independent relationship.

6. A signal decoding device according to claim 5, wherein the value of the t is decided based on a tolerance limit of an error occurring in the signal belonging to the decoded signal series, that cannot be detected when decoding.

7. A signal decoding device according to claim 6, wherein the shift processing comprises row replacement.

8. A signal decoding device according to claim 5, wherein the unit decoder decodes the encoded signal using a low density parity check code.

9. A signal decoding device according to claim 5, wherein the second partial matrix has a relationship in which prescribed shift processing is applied, with respect to elements of the first partial matrix.

10. A signal storage system having a write channel and a read channel, wherein the write channel comprises:
a first encoder for run-length encoding of data;
a second encoder for further encoding data encoded by the first encoder, using a low density parity check code; and
a writing unit for writing the data encoded by the second encoder, to the storage device;

the read channel comprises:
a reading unit for reading the data encoded by the second encoder, from the storage device;
a soft output detection unit for calculating likelihood for the data read by the reading unit and for outputting a soft decision value;
a second decoder, corresponding to the second encoder, for decoding the data outputted from the soft output detection unit; and
a first decoder, corresponding to the first encoder, for further decoding the data decoded by the second decoder;

and wherein
the second decoder has a unit decoder that, when the data outputted from the soft output detection unit is decoded, performs multiplication of the decoded data by a matrix;
if s and t are natural numbers, $s \geq t \geq 2$, the unit decoder uses a matrix in which, among s columns extracted from the matrix, t columns or less have a linearly independent relationship; and
the s columns are multiplied by a portion of the decoded data in which error occurrence frequency is relatively high.

11. A signal storage system according to claim 10, the system further comprising:
a storage device for storing prescribed data; and
a controller for controlling writing of data to the storage device, and reading of data from the storage device; wherein
the read channel reads, according to an instruction of the controller, data stored in the storage device; and
the write channel writes, according to an instruction of the controller, prescribed data to the storage device.

12. A signal storage system according to claim 10, wherein the system is integrated on at least one semiconductor board.

13. A signal storage system having a write channel and a read channel, wherein the write channel comprises:
a first encoder for run-length encoding of data;
a second encoder for further encoding data encoded by the first encoder, using a low density parity check code; and
a writing unit for writing the data encoded by the second encoder to the storage device;

the read channel comprises:
a reading unit for reading the data encoded by the second encoder, from the storage device;
a soft output detection unit for calculating likelihood for the data read by the reading unit and for outputting a soft decision value;
a second decoder, corresponding to the second encoder, for decoding the data outputted from the soft output detection unit; and a first decoder, corresponding to the first encoder, for further decoding the data decoded by the second decoder; and wherein the second decoder has a unit decoder that, when the data outputted from the soft output detection unit is decoded, performs multiplication of the decoded data by a matrix;

if s and t are natural numbers, $s \geq t \geq 2$, the unit decoder uses a matrix in which, among s columns extracted from the matrix, t columns or less have a linearly independent relationship; and the s columns are adjacent in the matrix.

14. A signal storage system according to claim 13, the system further comprising:

a storage device for storing prescribed data; and a controller for controlling writing of data to the storage device, and reading of data from the storage device; wherein the read channel reads, according to an instruction of the controller, data stored in the storage device; and the write channel writes, according to an instruction of the controller, prescribed data to the storage device.

15. A signal storage system according to claim 13, wherein the system is integrated on at least one semiconductor board.

* * * * *